(12) United States Patent
Vaske et al.

(10) Patent No.: US 10,629,409 B2
(45) Date of Patent: Apr. 21, 2020

(54) SPECIMEN PREPARATION AND INSPECTION IN A DUAL-BEAM CHARGED PARTICLE MICROSCOPE

(71) Applicant: FEI Company, Hillsboro, OR (US)

(72) Inventors: Frantisek Vaske, Brno (CZ); Tomáš Vystavěl, Brno (CZ); Daniel Bosák, Mikulůvka (CZ)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/036,017

(22) Filed: Jul. 16, 2018

(65) Prior Publication Data

US 2019/0108971 A1 Apr. 11, 2019

(30) Foreign Application Priority Data

Jul. 20, 2017 (EP) .................................... 17182299

(51) Int. Cl.
*H01J 37/26* (2006.01)
*H01J 37/20* (2006.01)
(Continued)

(52) U.S. Cl.
CPC ............... *H01J 37/26* (2013.01); *G01N 1/32* (2013.01); *H01J 37/20* (2013.01); *H01J 37/244* (2013.01);
(Continued)

(58) Field of Classification Search
CPC .......... H01J 37/26; H01J 37/20; H01J 37/244; H01J 37/3053; H01J 2237/007;
(Continued)

(56) References Cited

U.S. PATENT DOCUMENTS

2002/0166976 A1 11/2002 Sugaya et al.
2008/0258056 A1* 10/2008 Zaykova-Feldman ......................
G01N 23/04
250/307
(Continued)

FOREIGN PATENT DOCUMENTS

| EP | 0735564 | 10/1996 |
|---|---|---|
| JP | 2005062130 | 3/2005 |
| WO | 2011011661 | 1/2011 |

*Primary Examiner* — Nicole M Ippolito (57) ABSTRACT

A method of preparing a specimen in a dual-beam charged particle microscope having:
  an ion beam column, that can produce an ion beam that propagates along an ion axis;
  an electron beam column, that can produce an electron beam that propagates along an electron axis,
comprising the following steps:
  Providing a precursor sample on a sample holder;
  Using said ion beam to cut a furrow around a selected portion of said sample;
  Attaching a manipulator needle to said portion, severing said portion from the rest of said sample, and using the needle to perform a lift-out of the portion away from the rest of the sample,
particularly comprising:
  Configuring the manipulator needle to have multiple degrees of motional freedom, comprising at least:
    Eucentric tilt $\theta$ about a tilt axis that passes through an intersection point of said ion and electron axes and is perpendicular to said electron axis;
    Rotation $\varphi$ about a longitudinal axis of the needle;
  Whilst maintaining said portion on said needle, using said ion beam to machine at least one surface of said portion, so as to create said specimen;
(Continued)

Whilst maintaining said portion on said needle, inspecting it with said electron beam, for at least two different values of said φ rotation.

20 Claims, 4 Drawing Sheets

(51) Int. Cl.
  *H01J 37/244* (2006.01)
  *H01J 37/305* (2006.01)
  *G01N 1/32* (2006.01)

(52) U.S. Cl.
  CPC ...... *H01J 37/3053* (2013.01); *H01J 37/3056* (2013.01); *H01J 2237/2007* (2013.01); *H01J 2237/208* (2013.01); *H01J 2237/20207* (2013.01); *H01J 2237/20242* (2013.01); *H01J 2237/20285* (2013.01); *H01J 2237/262* (2013.01); *H01J 2237/28* (2013.01); *H01J 2237/31745* (2013.01); *H01J 2237/31749* (2013.01)

(58) Field of Classification Search
  CPC ..... H01J 2237/2027; H01J 2237/20242; H01J 2237/20285; H01J 2237/262; H01J 2237/31745
  USPC ............. 250/306, 307, 309, 310, 311, 492.1, 250/492.2, 492.21, 492.22, 492.23, 492.3
  See application file for complete search history.

(56) References Cited

U.S. PATENT DOCUMENTS

| | | | |
|---|---|---|---|
| 2010/0090345 A1* | 4/2010 | Sun | C23C 18/1642 257/769 |
| 2013/0248354 A1* | 9/2013 | Keady | H01J 37/3005 204/192.33 |
| 2016/0356729 A1* | 12/2016 | Bauer | H01J 37/20 |
| 2017/0122852 A1* | 5/2017 | Uemoto | G01N 1/28 |
| 2019/0017904 A1* | 1/2019 | Giannuzzi | G01N 1/06 |

* cited by examiner

SPECIMEN PREPARATION AND INSPECTION IN A DUAL-BEAM CHARGED PARTICLE MICROSCOPE

This application claims priority to European application EP 17182299.2 filed on Jul. 20, 2017.

The invention relates to a method of preparing a specimen in a dual-beam charged particle microscope having:
  an ion beam column, that can produce an ion beam that propagates along an ion axis;
  an electron beam column, that can produce an electron beam that propagates along an electron axis, comprising the following steps:
  Providing a precursor sample on a sample holder;
  Using said ion beam to cut a furrow around a selected portion of said sample;
  Attaching a manipulator needle to said portion, severing said portion from the rest of said sample, and using the needle to perform a lift-out of the portion away from the rest of the sample, The invention also relates to a dual-beam charged particle microscope in which such a method can be performed.

A manipulator needle as alluded to here is sometimes referred to as a nanomanipulator.

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example. More specifically:
  In an SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation is/are then detected and used for image accumulation purposes.
  In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.

As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance.

It should be noted that, in addition to imaging and performing (localized) surface modification (e.g. milling, etching, deposition, etc.), a charged particle microscope may also have other functionalities, such as performing spectroscopy, examining diffractograms, etc.

In all cases, a Charged Particle Microscope (CPM) will comprise at least the following components:
  A particle source, such as a Schottky electron source or ion source.
  An illuminator, which serves to manipulate a "raw" radiation beam from the source and perform upon it certain operations such as focusing, aberration mitigation, cropping (with a diaphragm), filtering, etc. It will generally comprise one or more (charged-particle) lenses, and may comprise other types of (particle-) optical components as well. If desired, the illuminator can be provided with a deflector system that can be invoked to cause its exit beam to perform a scanning motion across the workpiece being investigated.
  A workpiece holder, on which a workpiece under investigation can be held and positioned (e.g. tilted, rotated). If desired, this holder can be moved so as to effect scanning motion of the workpiece with respect to the beam. In general, such a workpiece holder will be connected to a positioning system. When designed to hold cryogenic workpieces, the workpiece holder can comprise means for maintaining said workpiece at cryogenic temperatures, e.g. using an appropriately connected cryogen vat. In general, a CPM may comprise various different types of workpiece holder, which can be invoked in different situations. Some such workpiece holders may be needle-like in form, others may resemble a finger or (articulated) arm, and others may take the form of a table or block, for example, depending on the type of workpiece/activity for which they are intended.
  A detector (for detecting radiation emanating from an irradiated workpiece), which may be unitary or compound/distributed in nature, and which can take many different forms, depending on the radiation being detected. Examples include photodiodes, CMOS detectors, CCD detectors, photovoltaic cells, X-ray detectors (such as Silicon Drift Detectors and Si(Li) detectors), etc. In general, a CPM may comprise several different types of detector, selections of which can be invoked in different situations.

In the particular case of a dual-beam microscope, there will be (at least) two sources/illuminators (particle-optical columns), for producing two different species of charged particle. Commonly, an electron column (e.g. arranged vertically) will be used to image a workpiece, and an ion column (arranged at an angle to the electron column) can be used to (concurrently) modify (machine/process) and/or image (parts of) the workpiece, whereby the workpiece holder can be positioned so as to suitably "present" a surface of the workpiece to the employed electron/ion beams.

In the case of a transmission-type microscope (such as a (S)TEM, for example), a CPM will specifically comprise:
  An imaging system (imaging particle-optical column), which essentially takes charged particles that are transmitted through a specimen (plane) and directs (focuses) them onto analysis apparatus, such as a detection/imaging device, spectroscopic apparatus (such as an EELS device: EELS=Electron Energy-Loss Spectroscopy), etc. As with the illuminator referred to above, the imaging system may also perform other functions, such as aberration mitigation, cropping, filtering, etc., and it will generally comprise one or more charged-particle lenses and/or other types of particle-optical components.

It should be noted that an SEM can be provided with a transmitted electron detector, so that it can be used in a manner similar to a (S)TEM. Such an apparatus/mode is sometimes referred to a Transmissive SEM (TSEM) apparatus/mode.

As set forth above, a specimen to be viewed in a (S)TEM generally has to be very thin (e.g. with a thickness of the order of a few hundred nm, or less), so as to allow sufficient transmission of electrons therethrough. A thin (flake-like) specimen of this type is conventionally referred to as a lamella, and is generally cut from a larger ("bulk") sample in a dual-beam apparatus such as a FIB-SEM. This is generally done using a process as set forth in the opening paragraph above, whereby, after lift-out, the portion (chunk) liberated from the rest of the sample is typically machined (FIB-milled) so as to thin it—eventually turning it into a specimen that is ready for use in a (S)TEM (or other type of CPM).

Unfortunately, this tends to be a very delicate and time-consuming procedure, which can cause a substantial (and expensive) bottleneck in industrial situations such as semiconductor device inspection, biological tissue studies (e.g. in drug development and testing), and geological analysis workflows (e.g. in petrology/mineralogy). Specific problems with current implementations of the procedure include the following:

In conventional dual-beam apparatus, two different holders are required for lift-out and FIB milling, thereby necessitating a transfer (of the lifted-out portion) between the two. Since the tiny sample portion involved is generally attached to each of these holders by a spot weld, such a transfer involves de-welding and re-welding operations, which can damage the sample portion, and even lead to its loss (if it falls off one of the holders during transfer). Accordingly, transfer needs to be performed carefully and slowly by a skilled operator—which adversely affects throughput and available resources.

Thinning of the lifted-out sample portion generally cannot be performed blindly: instead, SEM imagery of the portion may need to be acquired at regular intervals during the thinning process, so as to check how the thinning procedure is progressing. This typically requires several imaging iterations—again adversely impacting throughput and available resources.

It is an object of the present disclosure to address these issues. More specifically, it is an object of the present disclosure to provide an alternative specimen (e.g. lamella or tomography pillar) preparation procedure that is faster and more versatile than prior-art procedures.

These and other objects are achieved in a method as set forth in the opening paragraph above, characterized by:
  Configuring the manipulator needle to have multiple degrees of motional freedom, comprising at least:
    Eucentric tilt $\theta$ a about a tilt axis that passes through an intersection point of said ion and electron axes and is perpendicular to said electron axis;
    Rotation $\varphi$ about a longitudinal axis of the needle;
  Whilst maintaining said portion on said needle, using said ion beam to machine at least one surface of said portion, so as to create said specimen;
  Whilst maintaining said portion on said needle, inspecting it with said electron beam, for at least two different values of said (p rotation.
For good order, the following guiding remarks are made here:
  The $\theta$ tilt functionality does not have to (and typically will not) rotate through a full 360°; instead, the functionality will typically involve pivoting through a limited angular range (e.g. of the order of ca. 45 degrees), with said axes intersection point being the pivot point.
  It should also be noted that said $\varphi$ rotational functionality can, for example, be achieved by making:
    The whole needle $\varphi$-rotatable about a "shoulder" joint; or
    Dividing the needle into an "upper arm" and a "lower arm", with a $\varphi$-rotatable joint between the two (see FIG. 2, for example).
The invention has a number of pronounced advantages, which include the following:
  Configuring the manipulator needle to have said $\theta$ tilt functionality obviates the abovementioned transfer, since the needle now has the motional freedom to satisfactorily perform disparate tasks such as lift-out (e.g. at a first $\theta$ tilt value) and inspection with the electron beam (e.g. at a second, different $\theta$ tilt value).
  The needle's $\varphi$-rotational functionality allows (wide-angular-range) in situ TEM tomography to be performed on the lifted-out sample portion (using a TSEM detection set-up as referred to above). This is a huge advantage compared to regular SEM imaging, since it allows transmissive depth-imaging of bulk features in the imaged sample portion rather than just the superficial imaging of surface features offered by conventional SEM. This is important inter alia in that it allows the microscope operator to pre-emptively view sub-surface features that he would like to expose by the ion machining process, rather than blindly waiting for them to reveal themselves during an iterative mill/SEM-imaging routine; he can then pre-tune the milling process to progress a certain required depth into the sample portion, so as to reach the features in question. This is of particular advantage when viewing semiconductor device samples, because of the various hidden layers of device architecture—only one of which may be of interest to the microscope operator.
  Although in situ (S)TEM tomography performed in this manner might be considered somewhat sub-optimal because of the lower primary (input beam) energies typically available from a SEM column as opposed to a dedicated TEM column, it can still be very appealing to a wide audience. This is inter alia because a dedicated TEM generally requires a much more skilled operator than a SEM—so the current invention allows "basic" (S)TEM tomography to be done in a FIB-SEM by less-skilled personnel than would otherwise be required. Moreover, TEMs tend to be larger and more expensive than FIB-SEMs, so certain users would find it attractive to no longer have to use dedicated TEMs. In addition, not having to remove a sample portion/specimen from one apparatus (a FIB-SEM) and load it into another (a dedicated TEM) helps prevent damage to delicate samples, and saves time. If desired, a dual-beam microscope can be provided with an internal "library" for in situ storage/retrieval of specimens prepared/imaged according to the present disclosure.

It should be noted that, in general, the number of different $\varphi$ rotational values used in a particular (S)TEM tomography investigation is a matter of choice: to give a non-limiting example, one could, for instance, accrue a tilt series/sinogram comprising images made at (say) 100 different $\varphi$ increments of 1° (50 on each side of a nominal (zero) value)—though the skilled artisan will be able to contrive many other possible alternatives.

In a particular embodiment, the (S)TEM tomography referred to above is performed at a tilt value $\theta=0$ corresponding to a needle orientation that is substantially perpendicular to said electron beam. The inventors have found that this orientation of the needle gives an optimal geometry for acquisition of a tomographic tilt series; however, it should be realized that a tilt series could also be performed at other α values, if preferred in a given situation.

In a particular embodiment:
The employed manipulator needle holds a detachable tool comprising:
A plate;
At least one appendage extending from said plate;
Said sample portion is adhered to said appendage.

Although, as set forth above, the present invention allows a sample portion—and a machined specimen ultimately resulting therefrom—to be extensively imaged in the dual-beam microscope used in its extraction and further processing, there may still be a desire to image (or otherwise process) the specimen in a different apparatus, such as a TEM, X-ray CT apparatus or fluorescence microscope, for example. The present embodiment facilitates such scenarios in that the (delicate) lifted-out sample portion is mounted ab initio onto a universal/versatile tool (assistive carrier), which can be more easily gripped and mounted by/in other (types of) apparatus. Such a tool essentially acts as a durable handling interface between the delicate sample portion/specimen and the various handling implements that need to grip, transfer, store and mount it in its journey to and through other apparatus. The protruding "appendage" (or multiple appendages) on the tool allow easy mounting (e.g. spot welding) of the lifted-out sample portion (or multiple portions) thereon, while the plate of the tool from which the appendage extends presents a larger, less delicate and more standardized body/surface to be gripped. An example of such a tool is a so-called "lift-out" grid (specialized TEM grid).

Figure 4:
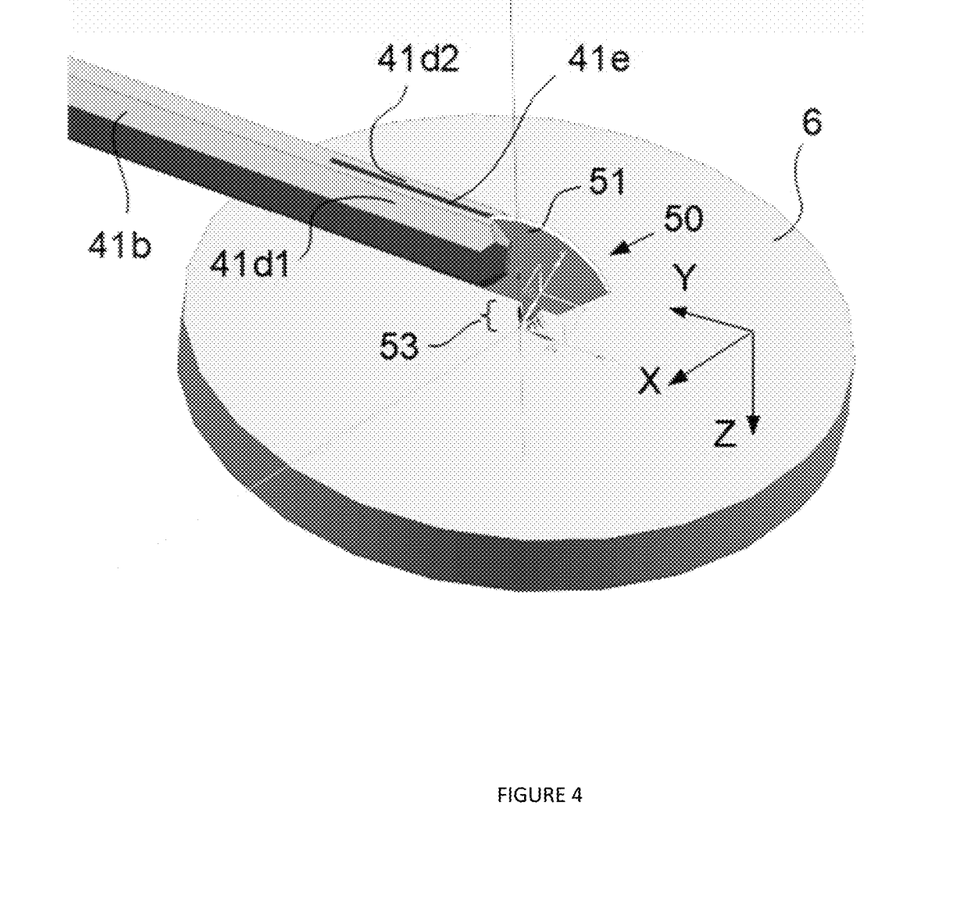
FIG. 4 shows a perspective view of the subject of FIGS. 3A/3B in conjunction with part of a manipulator needle such as that illustrated in FIG. 2.

As regards the manner in which the manipulator needle "holds" the detachable tool, this may be achieved in various ways, including (for example):
Spot welding the plate of the tool to the needle;
Providing (an extremity of) the needle with a jaw that can grab the plate of the tool;
Providing (part of) the needle and (part of) the plate of the tool with co-operating connecting structures, e.g. complementary male/female interlocking structures;
Clamping the plate of the tool onto/into the needle using a sprung retainer, etc. See, for example, FIG. 4, in which a detachable tool is wedged into a slit-like gap between bifurcated prongs at an extremity of the needle, the plate of the tool inter alia being held in place by intrinsic elasticity of the bifurcated prongs (and by friction).

Figure 3A:
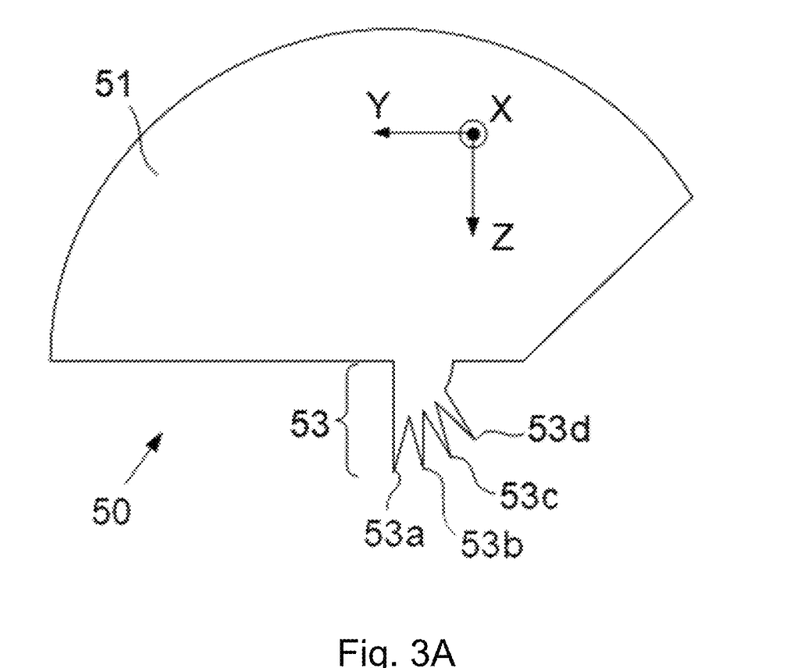
FIG. 3A renders a face-on view of a particular embodiment of a detachable tool according to the current invention.
Figure 3B:
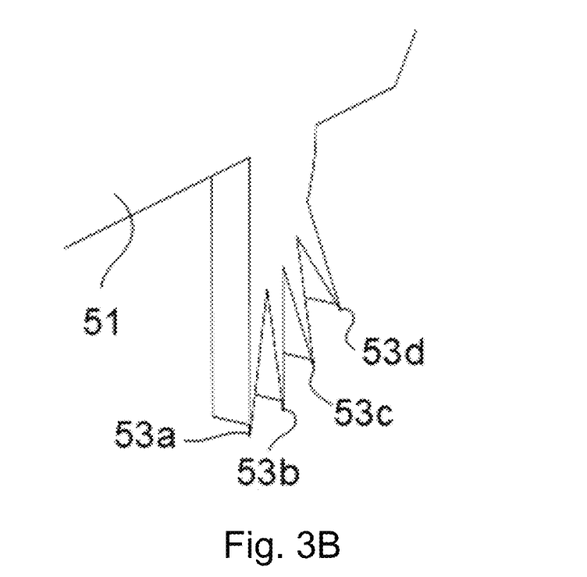
FIG. 3B shows a magnified, more detailed, perspective view of part of FIG. 3A.

In a refinement of the previous embodiment, the detachable tool comprises a plurality of appendages that extend/protrude from said plate in a fanned arrangement (see FIGS. 3A and 3B, for example). Such a fanned arrangement facilitates lift-out of multiple sample portions and attachment thereof onto the various appendages of the tool, since the fanned geometry prevents a given appendage from being obstructed by others when it is individually positioned above a sample (see FIG. 4, for example).

The invention will now be elucidated in more detail on the basis of exemplary embodiments and the accompanying schematic drawings, in which.

In the Figures, where pertinent, corresponding parts are indicated using corresponding reference symbols.

Embodiment 1

Figure 1:
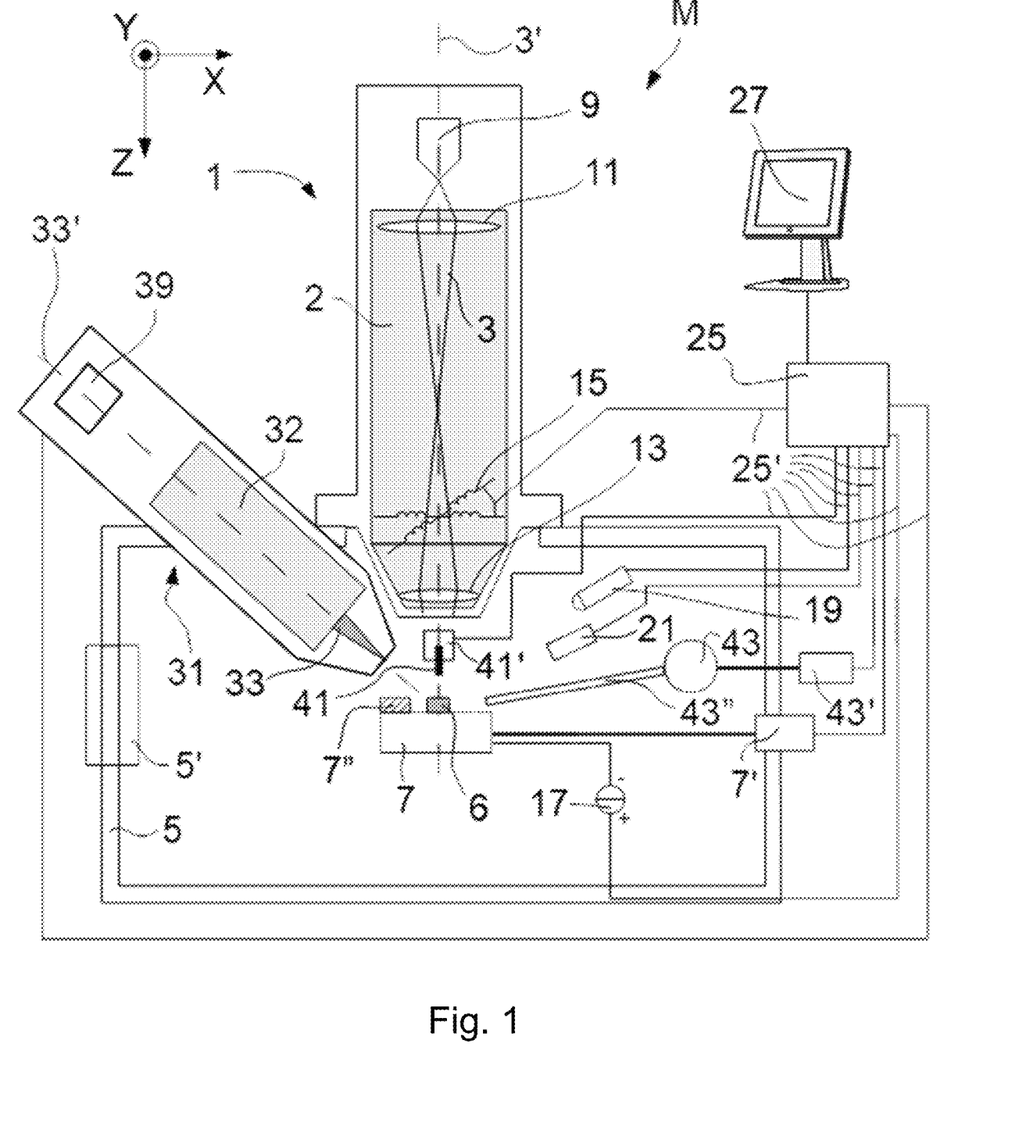
FIG. 1 renders a longitudinal cross-sectional elevation view of an embodiment of a dual-beam CPM in which the present invention is implemented.

FIG. 1 is a highly schematic depiction of an embodiment of a dual-beam charged particle microscope (CPM) in accordance with embodiments of the present disclosure. More specifically, FIG. 1 shows an embodiment of a FIB-SEM. The microscope M comprises a particle-optical column 1, which produces a beam 3 of charged particles (in this case, an electron beam) that propagates along a particle-optical axis 3'. The column 1 is mounted on a vacuum chamber 5, which comprises a sample holder 7 and associated actuator (s) 7' for holding/positioning a sample 6. The vacuum chamber 5 is evacuated using vacuum pumps (not depicted). With the aid of voltage supply 17, the sample holder 7, or at least the sample 6, may, if desired, be biased (floated) to an electrical potential with respect to ground. Also depicted is a vacuum port 5', which may be opened so as to introduce/remove items (components, samples) to/from the interior of vacuum chamber 5. A microscope M may comprise a plurality of such ports 5', if desired.

The column 1 (in the present case) comprises an electron source 9 (such as a Schottky gun, for example) and an illuminator 2. This illuminator 2 comprises (inter alia) lenses 11, 13 to focus the electron beam 3 onto the sample 6, and a deflection unit 15 (to perform beam steering/scanning of the beam 3). The microscope M further comprises a controller/computer processing apparatus 25 for controlling inter alia the deflection unit 15, lenses 11, 13 and detectors 19, 21, and displaying information gathered from the detectors 19, 21 on a display unit 27.

The detectors 19, 21 are chosen from a variety of possible detector types that can be used to examine different types of "stimulated" radiation emanating from the sample 6 in response to irradiation by the (impinging) beam 3. In the apparatus depicted here, the following (non-limiting) detector choices have been made:

Detector 19 is a solid state detector (such as a photodiode) that is used to detect cathodoluminescence emanating from the sample 6. It could alternatively be an X-ray detector, such as Silicon Drift Detector (SDD) or Silicon Lithium (Si(Li)) detector, for example.

Detector 21 is an electron detector in the form of a Solid State Photomultiplier (SSPM) or evacuated Photomultiplier Tube (PMT) [e.g. Everhart-Thornley detector], for example. This can be used to detect backscattered and/or secondary electrons emanating from the sample 6.

The skilled artisan will understand that many different types of detector can be chosen in a set-up such as that depicted, including, for example, an annular/segmented detector.

By scanning the beam 3 over the sample 6, stimulated radiation—comprising, for example, X-rays, infrared/visible/ultraviolet light, secondary electrons (SEs) and/or backscattered electrons (BSEs)—emanates from the sample 6. Since such stimulated radiation is position-sensitive (due to said scanning motion), the information obtained from the detectors 19, 21 will also be position-dependent. This fact allows (for instance) the signal from detector 21 to be used to produce a BSE image of (part of) the sample 6, which image is basically a map of said signal as a function of scan-path position on the sample 6.

The signals from the detectors 19, 21 pass along control lines (buses) 25', are processed by the controller 25, and displayed on display unit 27. Such processing may include operations such as combining, integrating, subtracting, false colouring, edge enhancing, and other processing known to the skilled artisan. In addition, automated recognition processes (e.g. as used for particle analysis) may be included in such processing.

In addition to the electron column 1 described above, the microscope M also comprises an ion-optical column 31. This comprises an ion source 39 and an illuminator 32, and these produce/direct an ion beam 33 along an ion-optical axis 33'. To facilitate easy access to sample 6 on holder 7, the ion axis 33' is canted relative to the electron axis 3'. As hereabove described, such an ion (FIB) column 31 can, for example, be used to perform processing/machining operations on the sample 6, such as incising, milling, etching, depositing, etc. Alternatively, the ion column 31 can be used to produce imagery of the sample 6. It should be noted that ion column 31 may be capable of generating various different species of ion at will, e.g. if ion source 39 is embodied as a so-called NAIS source; accordingly, references to ion beam 33 should not necessarily been seen as specifying a particular species in that beam at any given time—in other words, the beam 33 might comprise ion species A for operation A (such as milling) and ion species B for operation B (such as implanting), where species A and B can be selected from a variety of possible options.

Also illustrated is a Gas Injection System (GIS) 43, which can be used to effect localized injection of gases, such as etching or precursor gases, etc., for the purposes of performing gas-assisted etching or deposition. Such gases can be stored/buffered in a reservoir 43', and can be administered through a narrow nozzle 43", so as to emerge in the vicinity of the intersection of axes 3' and 33', for example.

It should be noted that many refinements and alternatives of such a set-up will be known to the skilled artisan, such as the use of a controlled environment within (a relatively large volume of) the microscope M, e.g. maintaining a background pressure of several mbar (as used in an Environmental SEM or low-pressure SEM).

Of particular interest in the context of the present invention is manipulator needle (nanomanipulator) 41, which can be used to assist in transferring items (e.g. samples, or parts thereof) to/from the sample holder 7. In relation to the present invention, a specific role of needle 41 is in the lift-out of a sample portion (that will ultimately become a TEM lamella) excised from the sample 6 using ion beam 33. As set forth above, conventional lift-out procedures adhere to process flows such as the following:
(i) A bulk sample 6 is held on (a generic sample area of) sample holder 7. Using an ion beam 33 from ion beam column 31, a furrow (trench/moat) is cut (milled, excavated, etched, ablated) around a selected portion 6a of sample 6. This portion 6a is still attached to the rest of sample 6 via a thin bridge of sample material.
(ii) The sample holder 7 is moved (using actuator system 7') so as to position sample portion 6a under—and in contact with—(an extremity of) needle 41, after which the two are welded together by a spot weld (e.g. using a beam 33 from ion column 31). Once this spot weld has been formed, the abovementioned bridge is severed (e.g. using a beam 33 from ion column 31) and the sample holder 7 is retracted from the needle 41, as a result of which portion 6a is lifted-out (liberated) by needle 41 from the rest of sample 6. Needle 41 lends itself to this purpose in view of its relatively elongate, thin, pointed form.
(iii) The sample holder 7 is now re-positioned under the needle 41 so as to position the lifted-out portion 6a just above auxiliary stage 7", which is a special purpose holder that piggybacks upon (main) sample holder 7. This auxiliary stage 7" has (additional) tilt functionality about the depicted Y axis ($R_Y$). The sample portion 6a is transferred from the needle 41 to the auxiliary stage 7", by first attaching portion 6a to the auxiliary stage 7" and then severing the abovementioned spot weld (e.g. using a beam 33 from ion column 31).
(iv) After transfer to auxiliary stage 7", the sample portion 6a is further machined (e.g. using a beam from ion column 31), so as to thin/mill it appropriately. The abovementioned $R_Y$-tilt functionality of auxiliary stage 7" is important for this purpose, in that it allows sample portion 6a to be presented at an adjustable angle to ion axis 33' (for milling) and electron axis 3' (for regular SEM imaging during (interruptions in) the milling process).

As set forth above, the techniques of the present disclosure allows a radical modification of the above discussed conventional workflow, inter alia in that:
the disclosed techniques obviate the transfer in step (iii); and
the disclosed techniques allow (S)TEM tomography to be done in step (iv), instead of (or supplemental to) regular SEM imaging.

To this end, according to the present disclosure, the needle 41 is provided with a special actuator system 41' that will now be set forth in more detail. Note that, as here illustrated, needle 41/actuator system 41' are located in front of electron axis 3'.

Figure 2:
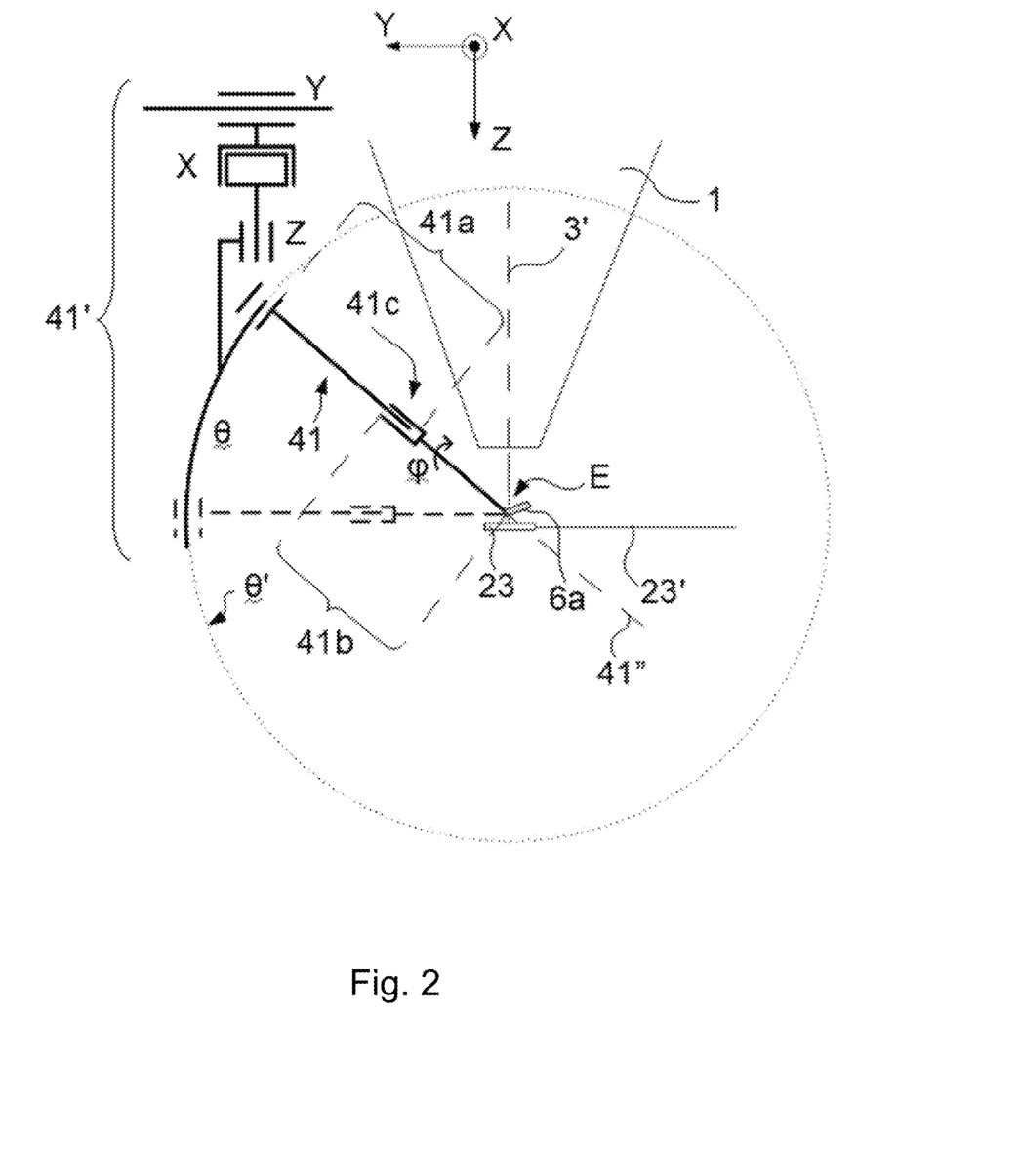
FIG. 2 shows a magnified, more detailed, end view of part of FIG. 1.

Turning now to FIG. 2, this shows a magnified, more detailed, end view of part of the subject of FIG. 1, in which sample holder 7 has been omitted so as to avoid clutter, and in which ion column 31 is now located behind (and obscured by) the depicted electron column 1. More particularly, it shows the general structure/operating principle of an embodiment of the actuator system 41' used to position manipulator needle 41. Unlike prior-art apparatus—in which needle 41 is either static or has only relatively basic motional capabilities—the actuator system 41' of the present disclosure has (inter alia) the ability to:
Tilt (a sample portion 6a mounted on) needle 41 about a eucentric rotation point E at which ion axis 33' and electron axis 3' intersect, the tilt axis being perpendicular to electron axis 3' (and, in this particular embodiment, substantially parallel to X/normal to the drawing plane). This tilt Degree of Freedom (DoF) is denoted by θ in FIG. 2, and symbolically indicated using dashed circle θ' (although, as already stated above, the tilt θ does not have to travel through 360°).
Rotate (at least a sample-carrying section 41b of) needle 41 about a longitudinal axis 41" of the needle. This rotational DoF is denoted by φ in FIG. 2. As here depicted, the needle 41 comprises a (co-linear) upper arm 41a and lower arm 41b, with a φ-rotatable actuated joint 41c between the two. The φ-rotational range of the joint 41c can be a full 360°, or multiples thereof, or just a portion thereof, as desired.

Also present in this particular embodiment are additional linear DoFs in X, Y and Z, which can be used to fine tune the position/stance of needle 41 so as to exactly locate a (region of interest) of sample portion 6a at point E.

As here schematically depicted, tilt θ can be effected using a linear motor that moves in an arc on a (truncated) curved/orbital track—though this does not have to be the manner in which such tilt is realized; as an alternative, the skilled artisan will realize that such tilt can, for example, be achieved as a composite result of simultaneous linear motions in Y and Z. Choosing and implementing particular means of effecting such tilt θ will be well within the technical ambit of the skilled artisan. As regards the described φ rotation, this can, for example, be achieved using a rotary motor. The actuators involved in producing the desired and φ DoFs (and additional X, Y and Z DoFs) may, for example, comprise piezo-motors, stepper motors, hydraulic actuators, etc.

According to the disclosure, the θ tilt DoF gives the manipulator needle 41 the motional capability it needs to be able to perform lift-out and subsequent ion milling and electron imaging of the sample portion 6a, without having to transfer the sample portion 6a to an assistive positioning device/carrier such as auxiliary stage 7". For example, lift-out occurs at a first θ tilt value (e.g. intermediate between horizontal and vertical in FIG. 2), whereas inspection with the electron beam occurs at a second, different θ tilt value (e.g. substantially horizontal in FIG. 2).

Also depicted in FIG. 2 is an optional (retractable) (S)TEM detector 23, which is held on an arm 23' so as to be positionable underneath a sample portion 6a on needle 41 (and above underlying sample holder 7). Such a mini-detector allows the set-up in FIGS. 1 and 2 to be operated in TSEM mode. Moreover, with this in mind, the abovementioned φ rotational functionality of needle 41 allows in situ (S)TEM tomography to be performed on sample portion 6a, at a variety of different φ stances (range of discrete values in a tilt series/sinogram).

Embodiment 2

FIG. 3A renders an elevation view of a particular embodiment of a detachable tool 50 according to the current disclosure. The illustrated tool 50 represents a modification of a (metallic) TEM grid/lift-out grid, and comprises:

A plate 51;

A (composite) appendage 53 extending from said plate 51.

In this particular instance, the (composite) appendage 53 comprises a plurality (four, in this specific case) of appendages 53A, 53B, 53C, 53D, in a fanned arrangement (i.e. with diverging members, like a collapsible fan, or bird's tail). FIG. 3B shows a magnified, more detailed, perspective view of this arrangement.

In use, different sample portions can be attached to various ones of the appendages 53A-53D. To facilitate this, one can, for example, use a set-up such as that illustrated in FIG. 4, which shows a perspective view of the subject of FIGS. 3A/3B in conjunction with part 41b of a manipulator needle such as that illustrated in FIG. 2. In this particular set-up, the plate 51 of the tool 50 is wedged into a slit-like gap 41e between bifurcated prongs 41d1, 41d2 at an extremity of the needle 41. The plate 51 is held in the YZ plane, and the θ tilt of the needle 41 allows different ones of the appendages 53A-53B to be "presented" to the sample 6 in a particular stance (e.g. vertical/parallel to Z).

The invention claimed is:

1. A method of preparing a specimen in a dual-beam charged particle microscope, the method comprising:
    using an ion beam to form a furrow around a selected portion of said sample;
    attaching a manipulator needle to said portion;
    severing said portion from the rest of said sample;
    using the needle to perform a lift-out of the portion away from the rest of the sample;
    configuring the manipulator needle to have multiple degrees of motional freedom, comprising at least:
        eucentric tilt θ about a tilt axis that passes through an intersection point of said ion and electron axes and is perpendicular to said electron axis;
        rotation φ about a longitudinal axis of the needle;
    whilst maintaining said portion on said needle, using said ion beam to machine at least one surface of said portion, so as to create said specimen; and
    whilst maintaining said portion on said needle, inspecting it with said electron beam, for at least two different values of said φ rotation.

2. A method according to claim 1, wherein said inspecting step comprises performing transmissive electron tomography on said portion, at a range of values of said rotation φ.

3. A method according to claim 2, in which said tomography is performed at a tilt value θ=0 corresponding to a needle orientation that is substantially perpendicular to said electron beam.

4. A method according to claim 1, wherein:
    said needle holds a detachable tool comprising:
        a plate; and
        at least one appendage extending from said plate;
    wherein said portion is adhered to said appendage.

5. A method according to claim 3, wherein said tool comprises a TEM Grid or Lift-Out Grid.

6. A method according to claim 2, wherein a plurality of appendages extend from the plate, in a fanned arrangement.

7. A dual-beam charged particle microscope comprising:
    an ion beam column, for producing an ion beam that propagates along an ion axis;
    an electron beam column, for producing an electron beam that propagates along an electron axis;
    a sample holder, for holding a sample;
    a manipulator needle, which can be attached to a portion of said sample;
    a detector, for detecting radiation emanating from said portion in response to irradiation by said electron beam; and
    a controller, for at least partially controlling operation of said microscope,
    wherein said needle has multiple degrees of motional freedom, comprising at least:
        eucentric tilt θ about a tilt axis that passes through an intersection point of said ion and electron axes and is perpendicular to said electron axis; and
        rotation φ about a longitudinal axis of the needle.

8. A microscope according to claim 7, wherein said controller is configured to:
    select a first θ value, at which said manipulator needle is used to perform post-excision lift-out of said portion from said sample; and
    select a second θ value, different from said first θ value, at which said electron beam is used to inspect said portion.

9. A microscope according to claim 8, wherein:
    said detector is configured to detect electrons transmitted through said portion during said irradiation; and during said inspection step, said controller is configured to:
    drive said needle to at least two different φ values; and
    at each of said φ values, record an output from said detector.

10. A microscope according to claim 7, further includes a TEM grid comprising:
    a plate; and
    a plurality of appendages extending from said plate in a fanned arrangement.

11. An apparatus comprising:
    a sample stage for supporting a sample;
    a manipulator needle arranged to pivot about an axis that passes through an intersection point of ion and electron column axes and is perpendicular to the electron column axis, and further arranged to rotate around a longitudinal axis of the manipulator needle; and
    a controller coupled to control at least the manipulator needle during lift-out, milling and imaging operations, the controller causing the manipulator to:
        during the lift-out operation, move the manipulator to a first location about the pivot point;
        during the milling operation move the manipulator to a second location about the pivot point, the second location different than the first location, wherein the portion is milled by an ion beam; and
        during the imaging operation, causes the manipulator to rotate around the longitudinal axis, wherein images are acquired with an electron beam.

12. The apparatus of claim 11, wherein the first location is an intermediate location between horizontal and vertical orientations.

13. The apparatus of claim 11, wherein the second location is a horizontal location.

14. The apparatus of claim 11, wherein during the milling operation, the controller further causes the manipulator to rotate around the longitudinal axis.

15. The apparatus of claim 11, wherein the imaging operation includes scanning transmission electron microscopy of the portion.

16. The apparatus of claim 11, further including a detachable tool coupled to the end of the manipulator, the detachable tool including a plate and at least one appendage, the at least one appendage configured to couple to the portion.

17. The apparatus of claim 16, wherein the detachable tool includes a plurality of appendages in a fanned arrangement.

18. The apparatus of claim 11, wherein the manipulator includes an upper arm and a lower arm, the lower arm coupled to rotate around the longitudinal axis of the manipulator while the upper arm remains stationary.

19. The apparatus of claim 11, wherein during the imaging operation, the controller causes the manipulator to rotate around to at least two locations, wherein an image of the portion is acquired at each of the two locations.

20. The apparatus of claim 11, wherein during the imaging operation, the controller causes the manipulator to move to a horizontal location about the pivot point.

* * * * *